US 11,885,647 B2

(12) United States Patent
Dewall (10) Patent No.: US 11,885,647 B2
(45) Date of Patent: Jan. 30, 2024

(54) ACCELEROMETER APPARATUSES AND SYSTEMS FOR NOISE REJECTION (71) Applicant: Kionix, Inc., Ithaca, NY (US)

(72) Inventor: Jonah Dewall, Lansing, NY (US)

(73) Assignee: ROHM Co., Ltd., Kyoto (JP)

(*) Notice: Subject to any disclaimer, the term of this patent is extended or adjusted under 35 U.S.C. 154(b) by 0 days.

(21) Appl. No.: 17/591,086

(22) Filed: Feb. 2, 2022

(65) Prior Publication Data
US 2022/0252439 A1 Aug. 11, 2022

Related U.S. Application Data (60) Provisional application No. 63/146,332, filed on Feb. 5, 2021.

(51) Int. Cl.
G01D 18/00 (2006.01)
H03H 11/12 (2006.01)
(Continued)

(52) U.S. Cl.
CPC .............. *G01D 18/00* (2013.01); *G01R 29/26* (2013.01); *H03F 3/45475* (2013.01); *H03H 11/126* (2013.01)

(58) Field of Classification Search
CPC ........ G01D 18/00; G01R 29/00; G01R 29/26; H03F 3/45; H03F 3/45475;
(Continued)

(56) References Cited

U.S. PATENT DOCUMENTS 5,053,713 A * 10/1991 Henoch .................. G01D 18/00
324/537
2009/0201373 A1* 8/2009 Yamaguchi .......... H04N 25/616
327/336
(Continued)

FOREIGN PATENT DOCUMENTS

WO 2016182993 A2 11/2016

OTHER PUBLICATIONS

Wang et al., "A monolithic CMOS MEMS accelerometer with chopper correlated double sampling readout circuit," 2011 IEEE International Symposium of Circuits and Systems (ISCAS), Rio de Janeiro, Brazil, 2011, pp. 2023-2026. (Year: 2011).*
(Continued)

Primary Examiner — Son T Le
Assistant Examiner — Matthew W. Baca
(74) Attorney, Agent, or Firm — Sterne, Kessler, Goldstein & Fox P.L.L.C.

(57) ABSTRACT

A sensor apparatus includes a resonator, a transducer, a damping resistor, a first switch, a filter stage, a second switch, and a noise rejection stage. The transducer is configured to detect a position of the resonator. The damping resistor is configured to electrostatically actuate the transducer and convert a thermomechanical noise of the resonator to an electromechanical noise. The first switch is configured to receive a first signal from the transducer. The filter stage is configured to receive the first signal and adjust a phase and a gain of the first signal and output a filtered first signal. The second switch is configured to receive a second signal from the transducer. The noise rejection stage is configured to receive the filtered first signal and the second signal and reduce the filtered first signal from an output signal.

14 Claims, 5 Drawing Sheets (51) Int. Cl.
*H03F 3/45* (2006.01)
*G01R 29/26* (2006.01)

(58) Field of Classification Search
CPC ............... H03F 3/45497; H03F 3/4552; H03F
3/45547; H03F 3/45551; H03F 3/45556;
H03F 3/456; H03F 3/45605; H03F
3/45609; H03F 3/45614; H03F 2200/261;
H03F 2203/45511; H03F 2203/45526;
H03H 11/126; H03H 11/1269; H03H
11/1286; H03H 11/1291; H03H 11/16;
H03H 11/20; G01P 15/00; G01P 15/08;
G01P 2015/0828; G01P 15/097; G01P
15/18; G01C 19/5776
See application file for complete search history.

(56) References Cited

U.S. PATENT DOCUMENTS

| | | | |
|---|---|---|---|
| 2014/0318906 A1* | 10/2014 | Deimerly | B81B 7/0016 29/610.1 |
| 2015/0177272 A1 | 6/2015 | Clark | |
| 2016/0334213 A1 | 11/2016 | DeWall | |
| 2017/0023429 A1 | 1/2017 | Straeussnigg et al. | |
| 2019/0140612 A1* | 5/2019 | Elsayad | H03H 9/02409 |
| 2019/0337014 A1* | 11/2019 | Chatain | H03K 19/018585 |
| 2020/0300629 A1* | 9/2020 | Che | H03M 1/822 |
| 2020/0407218 A1 | 12/2020 | Chodavarapu et al. | |
| 2021/0250008 A1* | 8/2021 | Levinzon | G01H 11/08 |

OTHER PUBLICATIONS

Liu, et al., "Design of Readout Circuits Used for Micro-machined Capacitive Accelerometer," 2007 2nd IEEE International Conference on Nano/Micro Engineered and Molecular Systems, Bangkok, Thailand, 2007, pp. 537-541. (Year: 2007).*

Mathew Varghese, "Resistive Damping of Pulse-Sensed Capacitive Position Sensors," Master's Thesis, Massachusetts Institute of Technology (MIT), pp. 1-32, Mar. 27, 1998, 32 pages.

Edward K. Chan and Robert W. Dutton, "Effects of capacitors, resistors and residual charge on the static and dynamic performance of electrostatically-actuated devices," Proc. SPIE 3680, Design, Test, and Microfabrication of MEMS and MOEMS, pp. 1-11, Mar. 10, 1999, 11 pages.

International Search Report and Written Opinion for International Application No. PCT/US2022/015087, USPTO, Alexandria, VA, dated May 12, 2022, 14 pages.

* cited by examiner

ACCELEROMETER APPARATUSES AND SYSTEMS FOR NOISE REJECTION

CROSS REFERENCE TO RELATED APPLICATION

This application claims priority to U.S. Provisional Application No. 63/146,332, filed Feb. 5, 2021, which is hereby incorporated herein in its entirety by reference.

BACKGROUND

Field

The present disclosure relates to sensor apparatuses and systems, for example, electrostatically damped accelerometer apparatuses and systems.

Background

A microelectromechanical system (MEMS) can be fabricated using semiconductor device fabrication technologies. MEMS utilizes microelectronic processing techniques to reduce mechanical components down to the scale of microelectronics. MEMS offers the opportunity to integrate mechanical sensor elements and their associated signal processing electronics onto a single chip in a common manufacturing process. MEMS can be used for various devices including accelerometers, gyroscopes, inertial measurement units, digital micromirrors, optical switching units, pressure sensors, microphones, resonators, or magnetometers. For example, accelerometer elements constructed using MEMS include structures similar to a standard accelerometer: a proof-mass, restoring springs, a displacement transducer, some form of damping, and a case to which everything is attached. Such a MEMS accelerometer can be wire bonded to an Application Specific Integrated Circuit (ASIC). The MEMS accelerometer and ASIC can be packaged in a packaging unit typically constructed of three components: (1) a MEMS element that senses acceleration; (2) electronics included in an ASIC that transduces the MEMS element's response to acceleration into an electronic signal; and (3) a package that houses the MEMS element and the ASIC.

MEMS sensors (e.g., an accelerometer) can suffer from noise. For a mechanically damped system, thermomechanical noise is inversely proportional to the quality factor (Q) of the system. Thus, increasing Q of a system can reduce the system's thermomechanical noise. However, a flat frequency response typically needs near-critical damping (Q=½). For an electrostatically damped system, electromechanical noise is proportional to a damping resistance $R_d$ of a damping resistor in a series RC network. An electrostatically damped system can provide a flat frequency response for a high-Q mechanical system (e.g., Q=10). However, increasing the damping resistance $R_d$ of a high-Q mechanical system increases the system's electromechanical noise.

SUMMARY

Accordingly, there is a need to develop a MEMS sensor with both low thermomechanical noise of a lightly-damped mechanical system (i.e., high-Q) and flat frequency response of a critically damped electrical system (i.e., low-Q) through electrostatic damping, thereby reducing the electromechanical noise from the system's final output.

In some embodiments, a sensor apparatus includes a resonator, a transducer, a damping resistor, a first switch, a filter stage, a second switch, and a noise rejection stage. The transducer is configured to detect a position of the resonator. The damping resistor is configured to electrostatically actuate the transducer and convert a thermomechanical noise of the resonator to an electromechanical noise. The first switch is configured to receive a first signal from the transducer. The filter stage is configured to receive the first signal and adjust a phase and a gain of the first signal and output a filtered first signal. The second switch is configured to receive a second signal from the transducer. The noise rejection stage is configured to receive the filtered first signal and the second signal and reduce the filtered first signal from an output signal of the noise rejection stage.

In some embodiments, the first switch is controlled by a first phase signal and is configured to open or close an electrical pathway between the transducer and the damping resistor. In some embodiments, the second switch is controlled by a second phase signal and is configured to open or close an electrical pathway between the transducer and the noise rejection stage. In some embodiments, in a first configuration, the first switch is closed and the second switch is open, and a voltage difference between a constant input voltage to the resonator and a common voltage to the damping resistor electrostatically actuates the transducer and converts the thermomechanical noise of the resonator to the electromechanical noise. In some embodiments, in a second configuration, the first switch is open and the second switch is closed, and a pulse input voltage to the resonator produces a current correlated to the electromechanical noise.

In some embodiments, the filter stage includes a Sallen-Key topology and is configured to have about an infinite input impedance and about a zero output impedance. In some embodiments, the filtered first signal outputted by the filter stage matches a phase and a gain of the second signal.

In some embodiments, the noise rejection stage includes an analog front end configured to increase a gain of the second signal. In some embodiments, the analog front end includes a transimpedance amplifier.

In some embodiments, a sense axis of the transducer is aligned along a drive mode of the resonator. In some embodiments, a sense axis of the transducer is aligned along a sense mode of the resonator.

In some embodiments, the resonator includes a quality factor (Q) of about 1,000 to about 50,000. In some embodiments, the resonator includes a microelectromechanical system (MEMS) configured to adjust the position of the resonator. In some embodiments, the sensor apparatus comprises an accelerometer, a gyroscope, a pressure sensor, a resonator, or a magnetometer.

In some embodiments, the output signal is a first output signal, and the sensor apparatus further includes a second transducer, a second damping resistor, a third switch, a second filter stage, and a fourth switch. The second transducer is configured to detect a second position of the resonator. The second damping resistor is configured to electrostatically actuate the second transducer and convert the thermomechanical noise of the resonator to a second electromechanical noise. The third switch is configured to receive a third signal from the second transducer. The second filter stage is configured to receive the third signal and adjust a phase and a gain of the third signal and output a filtered third signal. The fourth switch is configured to receive a fourth signal from the second transducer. The noise rejection stage is configured to receive the filtered third signal and the fourth signal and reduce the filtered third signal from a second output signal. The noise rejection stage is configured to make a differential measurement between the output signal and the second output signal.

In some embodiments, a differential sensor system includes a resonator, a transducer, a second transducer, a damping resistor, a second damping resistor, a first switch, a filter stage, a second switch, a third switch, a second filter stage, a fourth switch, and a noise rejection stage. The transducer is configured to detect a first position of the resonator. The second transducer is configured to detect a second position of the resonator. The damping resistor is configured to electrostatically actuate the transducer and convert a thermomechanical noise of the resonator to an electromechanical noise. The second damping resistor is configured to electrostatically actuate the second transducer and convert the thermomechanical noise of the resonator to a second electromechanical noise. The first switch is configured to receive a first signal from the transducer. The filter stage is configured to receive the first signal and adjust a phase and a gain of the first signal and output a filtered first signal. The second switch is configured to receive a second signal from the transducer. The third switch is configured to receive a third signal from the second transducer. The second filter stage is configured to receive the third signal and adjust a phase and a gain of the third signal and output a filtered third signal. The fourth switch is configured to receive a fourth signal from the second transducer. The noise rejection stage is configured to receive the filtered first signal, the second signal, the filtered third signal, and the fourth signal, and reduce a first differential value between the filtered first signal and the filtered third signal from a second differential value between the second signal and the fourth signal.

In some embodiments, the differential sensor system further includes a first integrating capacitor, a fifth switch, a second integrating capacitor, and a sixth switch. The first integrating capacitor is coupled to the noise rejection stage. The fifth switch is configured to reset a charge on the first integrating capacitor. The second integrating capacitor is coupled to the noise rejection stage. The sixth switch is configured to reset a charge on the second integrating capacitor. The first and third switches are controlled by a first phase signal. The second and fourth switches are controlled by a second phase signal. The fifth and sixth switches are controlled by a third phase signal. In some embodiments, the differential sensor system is time-multiplexed.

In some embodiments, in a first configuration, the first, third, fifth, and sixth switches are closed and the second and fourth switches are open, and a voltage difference between a constant input voltage to the resonator and a common voltage to the damping resistor and the second damping resistor electrostatically actuates the transducer and the second transducer and converts a differential thermomechanical noise of the resonator to a differential electromechanical noise. In some embodiments, in a second configuration, the first, third, fifth, and sixth switches are open and the second and fourth switches are closed, and a pulse input voltage to the resonator produces a differential current correlated to the differential electromechanical noise.

In some embodiments, a method for reducing thermomechanical noise in a sensor apparatus while maintaining a flat frequency response includes applying a first phase signal to a first switch in a sensor apparatus to close the first switch, a second phase signal to a second switch in the sensor apparatus to open the second switch, and a voltage difference between a constant input voltage to a resonator of the sensor apparatus and a common voltage to a damping resistor of the sensor apparatus. The method further includes converting a thermomechanical noise of the resonator to an electromechanical noise. In some embodiments, the method further includes adjusting a phase and a gain of a first signal from a transducer of the sensor apparatus. The method further includes applying the first phase signal to the first switch to open the first switch, the second phase signal to the second switch to close the second switch, and a pulse input voltage to the resonator to produce a second signal from the transducer correlated to the electromechanical noise. In some embodiments, the method further includes reducing the electromechanical noise from an output signal.

In some embodiments, the method further includes filtering the first signal with a Sallen-Key topology to match a phase and a gain of the second signal. In some embodiments, the reducing includes subtracting the first signal from the second signal.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment (s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" as used herein indicates the value of a given quantity that can vary based on a particular technology. Based on the particular technology, the term "about" or "substantially" can indicate a value of a given quantity that varies within, for example, 1-15% of the value (e.g., ±1%, ±2%, ±5%, ±10%, or ±15% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/ or instructions may be described herein as performing certain actions. However, it should be appreciated that such descriptions are merely for convenience and that such actions in fact result from computing devices, processors, controllers, or other devices executing the firmware, software, routines, instructions, etc.

Exemplary Sensor Apparatuses

As discussed above, MEMS sensors (e.g., an accelerometer) can suffer from thermomechanical noise. Thermomechanical noise in a mechanical system is based on a force noise generator ($F_n$) associated with the thermal energy of the mechanical system. Thermomechanical noise is given by $$F_n = \sqrt{4k_B T R_m} \left[ \frac{N}{\sqrt{Hz}} \right],$$

where $k_B$ is Boltzmann's constant, T is the absolute temperature, and $R_m$ is the mechanical resistance (i.e., damping). For example, for a mechanically damped accelerometer, the mechanical resistance $R_m$ is mainly due to collisions of a proof-mass (e.g., resonator) with thermally excited gas molecules surrounding the proof-mass, but mechanical resistance $R_m$ can also include substrate damping (e.g., energy loss through substrate anchor point of the proof-mass) and thermoelastic damping (e.g., energy loss due to imperfect heat transfer caused by flexure bending of the proof-mass). The mechanical resistance is given by $$R_m = \frac{m\omega_0}{Q},$$

where m is the system's mass, $\omega_0$ is the system's natural (angular) frequency, and Q is the system's quality factor. The system's Q is a dimensionless parameter that describes the qualitative behavior of a damped oscillator or resonator (i.e., overdamped (Q<½), critically damped (Q=½), or underdamped (Q>½)), and is given by $$Q = \frac{\omega_0}{\Delta\omega},$$

where $\omega_0$ is the system's angular resonant frequency and $\Delta\omega$ is the system's angular half-power bandwidth. Thus, increasing Q of a system reduces the system's thermomechanical noise $F_n$.

Often a flat frequency response within the intended bandwidth of operation of a MEMS sensor (e.g., an accelerometer) is desired to provide constant sensitivity at all usable frequencies. A flat frequency response typically needs near-critical damping (Q=½). High-Q systems (e.g., Q=10) have significant peaking in the frequency response, and even low-Q systems (e.g., Q=2) can cause unwanted or unusable sensitivity changes as the input frequency approaches the system's resonant frequency ($\omega_0$). Hence, a flat frequency response requirement typically precludes increasing Q of a system to reduce thermomechanical noise $F_n$.

Damping can be applied electrostatically to a MEMS sensor by connecting a resistor in series with a sense capacitor to form a series RC network and applying a bias voltage across the series RC network. A biased RC network draws a current that produces a voltage swing across the resistor. The voltage swing produces a damping force on the MEMS sensor via electrostatic actuation with the sense capacitor. An electrostatically damped system can provide a flat frequency response for a high-Q mechanical system (e.g., Q=10). Such a system has a low thermomechanical noise $F_n$, but still suffers from electromechanical noise, since the overall noise due to damping is not eliminated but merely shifted from the mechanical domain to the electrical domain.

In the electrical domain, electrostatically damped MEMS sensors (e.g., an accelerometer) can suffer from electromechanical noise. Electromechanical noise, also known as Johnson-Nyquist noise, is the electronic noise generated by thermal agitation of charge carriers (e.g., electrons) within an electrical system (e.g., a resistor) at equilibrium. Electromechanical noise in an electrical system is based on a voltage noise generator ($V_n$) associated with the thermal energy of the electrical system. Electromechanical noise is given by $$V_n = \sqrt{4k_B T R_d} \left[\frac{V}{\sqrt{Hz}}\right],$$

where $k_B$ is Boltzmann's constant, T is the absolute temperature, and $R_d$ is the damping resistance of a damping resistor in the series RC network. Damping resistor values that provide sufficient damping are often large (e.g., $R_d$=100 MΩ). Hence, increasing the damping resistance $R_d$ of a high-Q mechanical system to provide a flat frequency response increases the system's electromechanical noise $V_n$, which is proportional to the high-Q mechanical system's thermomechanical noise $F_n$.

Embodiments of this disclosure provide a MEMS sensor with both low thermomechanical noise of a lightly-damped mechanical system (i.e., high-Q) and flat frequency response of a critically damped electrical system (i.e., low-Q) through electrostatic damping. Embodiments of this disclosure provide a MEMS sensor that can reduce the electromechanical noise from the system's final output.

Some embodiments are directed to sensor apparatuses and systems, such as sensor apparatus 100, sensor apparatus 100', and differential sensor system 100", for example. In some embodiments, a sensor can include a resonator, a transducer, a damping resistor, a damping switch, a sampling switch, a filter stage, an analog front end, and a noise rejection stage. The resonator is a resonating device (e.g., an accelerometer) that can oscillate at its resonant frequency. The resonator can be driven by an applied voltage (e.g., constant, pulsed, sinusoidal, etc.) and can generate signals of a precise frequency (e.g., the resonant frequency). The resonator can be a piezoelectric resonator which oscillates (i.e., generates mechanical strain) from an applied electrical charge. The transducer can detect a position of the resonator (e.g., along the "X-axis"). Also, the transducer can electrostatically actuate the resonator. The damping resistor can electrostatically actuate the transducer. The damping resistor can convert (i.e., change) thermomechanical noise of the resonator to electromechanical noise (e.g., an electrical signal). The damping switch can open and close an electrical pathway between the resonator and the damping resistor. Also, the damping switch can isolate (e.g., when closed) a series RC network of the sensor, which includes the resonator, the transducer, and the damping resistor. The sampling switch can open and close an electrical pathway between the resonator and the analog front end. Also, the sampling switch can isolate (e.g., when closed) a signal from the resonator containing electromechanical noise generated by the damping resistor. The filter stage can adjust a phase and a gain of a signal from the transducer. Also, the filter stage can preserve voltage ripples from the damping resistor on the signal from the transducer for a reference damping voltage. The analog front end can convert a sampling current to a voltage signal. Also, the analog front end can increase a gain of the sampling current for a second reference signal. The noise rejection stage can operate as a feedforward noise rejection stage. The noise rejection stage can reduce the electromechanical noise from an output voltage of the noise rejection stage based on the reference damping voltage from the filter stage and the second reference signal from the analog front end.

Figure 1:
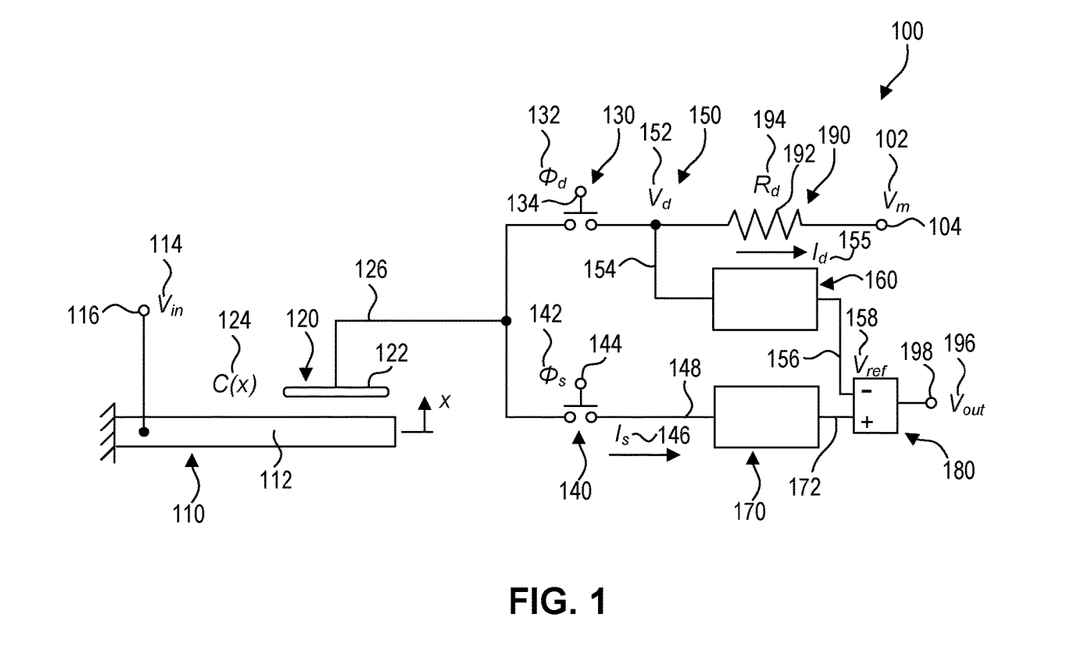
FIG. 1 is a schematic illustration and circuit diagram of a sensor apparatus, according to an exemplary embodiment.

FIG. 1 illustrates a schematic of sensor apparatus 100, according to an exemplary embodiment. Sensor apparatus 100 can be configured to be a low thermomechanical noise lightly-damped mechanical system (i.e., high-Q) with a flat frequency response of a critically damped electrical system (i.e., low-Q) through electrostatic damping and reduction of an electromechanical noise from the system's final output. Sensor apparatus 100 can be configured to transfer a thermomechanical noise due to mechanical damping in the mechanical domain to an electromechanical noise due to electrostatic damping in the electrical domain. And this electromechanical noise can be sampled and reduced from an output signal. In some embodiments, sensor apparatus 100 can include an electrostatically damped accelerometer. In some embodiments, sensor apparatus 100 can include an accelerometer, a gyroscope, a pressure sensor, a resonator, or a magnetometer.

As shown in FIG. 1, sensor apparatus 100 can include a resonator 110, a transducer 120, a damping resistor ($R_d$) 190, a damping switch 130, a sampling switch 140, a filter stage 160, an analog front end 170, and a noise rejection stage 180. Resonator 110 can include proof-mass 112, input voltage ($V_{in}$) 114, and input voltage contact 116. Proof-mass 112 can be a microelectromechanical system (MEMS) configured to adjust a position of resonator 110. A drive mode of resonator 110 can be along a vertical direction (i.e., "X-axis"). A sense mode of resonator 110 can be along a vertical direction (i.e., "X-axis"). Input voltage ($V_{in}$) 114 can be a constant voltage or a pulsed voltage to actuate proof-mass 112. In some embodiments, resonator 110 can be an accelerometer. For example, resonator 110 can be a tri-axis accelerometer. In some embodiments, resonator 110 can have a quality factor (Q) of about 1,000 to about 50,000. For example, resonator 110 can have a quality factor (Q) of 10,000. In some embodiments, resonator 110 can have a resonant frequency ($\omega_0$) of about 500 Hz to about 10 kHz. For example, resonator 110 can have a resonant frequency ($\omega_0$) of 4 kHz. In some embodiments, proof-mass 112 can have a mass (m) of about 0.01 µg to about 100 µg. For example, proof-mass 112 can have a mass (m) of about 0.1 µg. In some embodiments, resonator 110 can be a semiconductor, an oxide, a nitride, a dielectric, a metal, a polymer, or any combination thereof. For example, resonator 110 can be silicon. In some embodiments, input voltage ($V_{in}$) 114 can be about 0 V to about 15 V. For example, for a resonant frequency ($\omega_0$) of 4 kHz, input voltage ($V_{in}$) 114 can be about 3 V. In some embodiments, input voltage contact 116 can be coupled to a processor (not shown). For example, the processor can be an Application Specific Integrated Circuit (ASIC).

Sensor apparatus 100 can be an electrostatically damped system. Damping can be applied electrostatically to resonator 110 by connecting a damping resistor ($R_d$) 190 in series with transducer 120 to form a series RC network and applying a bias or common voltage ($V_m$) 102 across the series RC network. Thermally excited charge carriers within damping resistor ($R_d$) 190 produce an electromechanical noise (e.g., Johnson-Nyquist noise). The biased RC network draws a damping current ($I_d$) 155 that produces a voltage swing or damping voltage ($V_d$) 150 across damping resistor ($R_d$) 190. The electromechanical noise produced from damping resistor ($R_d$) 190 is superimposed onto damping voltage ($V_d$) 150. Damping voltage ($V_d$) 150 produces a damping force on resonator 110 via electrostatic actuation with transducer 120. Since the electromechanical noise superimposed onto damping voltage ($V_d$) 150 is an electrical signal, the electromechanical noise can be reduced from output voltage ($V_{out}$) 196 by noise rejection stage 180.

Transducer 120 can be configured to detect a position of resonator 110. For example, during a sampling phase. Transducer 120 can also be configured to electrostatically actuate resonator 110, for example, during a damping phase. Transducer 120 can include sense capacitor 122 with capacitance (C(x)) 124 and sense capacitor signal 126 connected to damping switch 130 and sampling switch 140. A sense axis of transducer 120 can be along a vertical direction (i.e., "X-axis") and be aligned along a drive mode of resonator 110 (e.g., "X-axis"). A sense axis of transducer 120 can be along a vertical direction (i.e., "X-axis") and be aligned along a sense mode of resonator 110 (e.g., "X-axis"). In some embodiments, as shown in FIG. 1, transducer 120 can be sense capacitor 122. In some embodiments, sense capacitor 122 can have a capacitance (C(x)) 124 of about 1 fF to about 300 fF. For example, sense capacitor 122 can have a capacitance (C(x)) 124 of about 150 fF. In some embodiments, transducer 120 can be a doped semiconductor or a conductor. For example, transducer 120 can include polysilicon (e.g., n-type, p-type), a metal, a conductive oxide, or any other suitable material capable of electrical conduction. In some embodiments, common voltage contact 104 can be coupled to a processor (not shown). For example, the processor can be an Application Specific Integrated Circuit (ASIC).

Damping resistor ($R_d$) 190 can be configured to electrostatically actuate transducer 120. Damping resistor ($R_d$) 190 can convert a thermomechanical noise of resonator 110 to an electromechanical noise, which can be detected by transducer 120 in some embodiments. Damping resistor ($R_d$) 190 can include resistor 192 with resistance ($R_d$) 194. Damping resistor ($R_d$) 190 can be connected between common voltage contact 104 with common voltage ($V_m$) 102 and damping voltage ($V_d$) 150 at damping voltage node 152. A voltage difference between input voltage ($V_{in}$) 114 and common voltage ($V_m$) 102 produces a bias across RC network (i.e., $R_d C(x)$) formed by damping resistor ($R_d$) 190, transducer 120, and resonator 110. The bias, along with a velocity of proof-mass 112, cause damping current ($I_d$) 155, which is directed through damping resistor ($R_d$) 190 and produces voltage ripples on damping voltage ($V_d$) 150. The voltage ripples of damping voltage ($V_d$) 150 produce damping forces on proof-mass 112 via electrostatic actuation of sense capacitor 122 and produce the electromechanical noise. In some embodiments, damping resistor ($R_d$) 190 can have a resistance ($R_d$) 194 of about 10 MΩ to about 1 GΩ. For example, damping resistor ($R_d$) 190 can have a resistance ($R_d$) 194 of about 100 MΩ. In some embodiments, damping resistor ($R_d$) 190 can include a switched-capacitor resistor. For example, damping resistor ($R_d$) 190 can include a capacitor and two switches whose resistance ($R_d$) 194 depends on the capacitance of the capacitor and the switching frequency of the two switches. In some embodiments, common voltage ($V_m$) 102 can be about 0 V to about 15 V. For example, for a resonant frequency ($\omega_0$) of 4 kHz, common voltage ($V_m$) 102 can be about 3 V.

Figure 6:
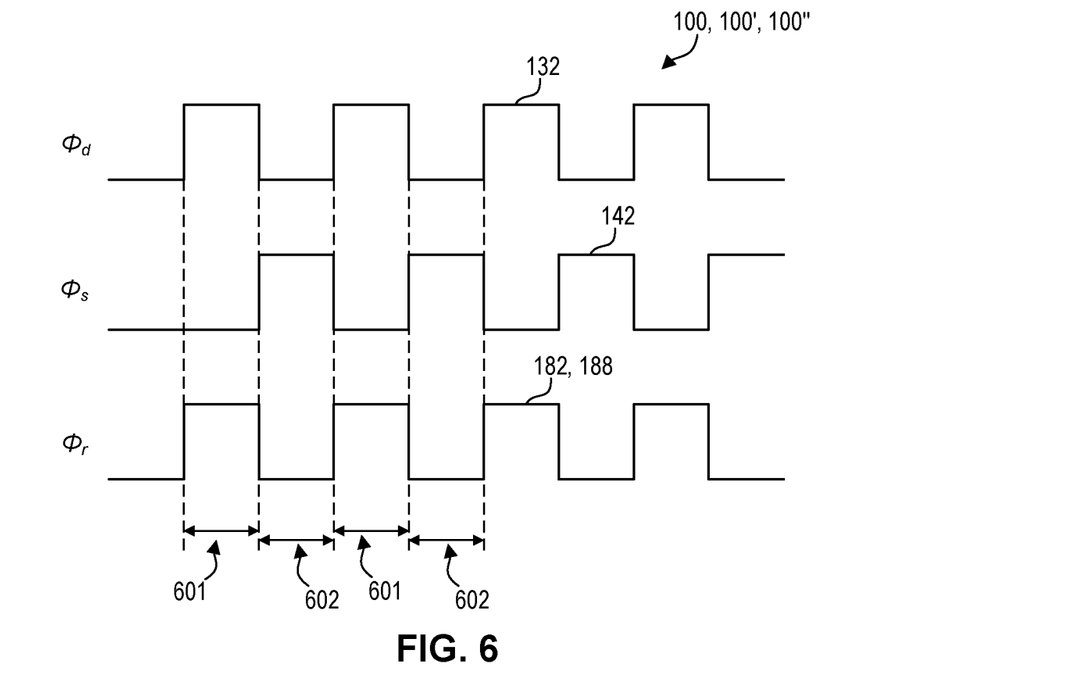
FIG. 6 is a schematic illustration of a time-multiplexed operation of a damping phase signal, a sampling phase signal, and a reset phase signal, according to an exemplary embodiment.

Damping switch 130 can be configured to receive sense capacitor signal 126 from transducer 120 in some embodiments. Damping switch 130 can include damping switch contact 134. Damping switch 130 can be configured to open or close an electrical pathway between transducer 120 and damping resistor ($R_d$) 190. Damping switch 130 can be an electronic component or device (e.g., a transistor). For example, damping switch 130 can be a pushbutton switch, a momentary switch, a spring-return switch, or a single-pole single-throw (SPST) switch. Damping switch 130 can be controlled by damping phase signal ($\Phi_d$) 132. For example, damping switch 130 can receive damping phase signal ($\Phi_d$) 132 to damping switch contact 134. Damping switch 130 can be considered open when damping phase signal ($\Phi_d$) 132 is a logic LOW voltage. Damping switch 130 can be considered closed when damping phase signal ($\Phi_d$) 132 is a logic HIGH voltage. Damping phase signal ($\Phi_d$) 132 can be triggered by a drive-synchronized signal, delayed by a desired amount. In some embodiments, damping phase signal ($\Phi_d$) 132 can be a binary electrical signal. For example, as shown in FIG. 6, damping phase signal ($\Phi_d$) 132 can be a transistor-transistor logic (TTL) signal.

Sampling switch 140 can be configured to receive sense capacitor signal 126 from transducer 120 in some embodiments. Sampling switch 140 can include sampling switch contact 144. Sampling switch 140 can be configured to open or close an electrical pathway between transducer 120 and noise rejection stage 180. Sampling switch 140 can be an electronic component or device (e.g., a transistor). For example, sampling switch 140 can be a pushbutton switch, a momentary switch, a spring-return switch, or a single-pole single-throw (SPST) switch. Sampling switch 140 can be controlled by sampling phase signal ($\Phi_s$) 142. For example, sampling switch 140 can receive damping phase signal ($\Phi_s$) 142 to sampling switch contact 144. Sampling switch 140 can be considered open when sampling phase signal ($\Phi_s$) 142 is a logic LOW voltage. Sampling switch 140 can be considered closed when sampling phase signal ($\Phi_s$) 142 is a logic HIGH voltage. Sampling phase signal ($\Phi_s$) 142 can be triggered by a drive-synchronized signal, delayed by a desired amount. In some embodiments, sampling phase signal ($\Phi_s$) 142 can be a binary electrical signal. For example, as shown in FIG. 6, sampling phase signal ($\Phi_s$) 142 can be a transistor-transistor logic (TTL) signal.

Figure 5:
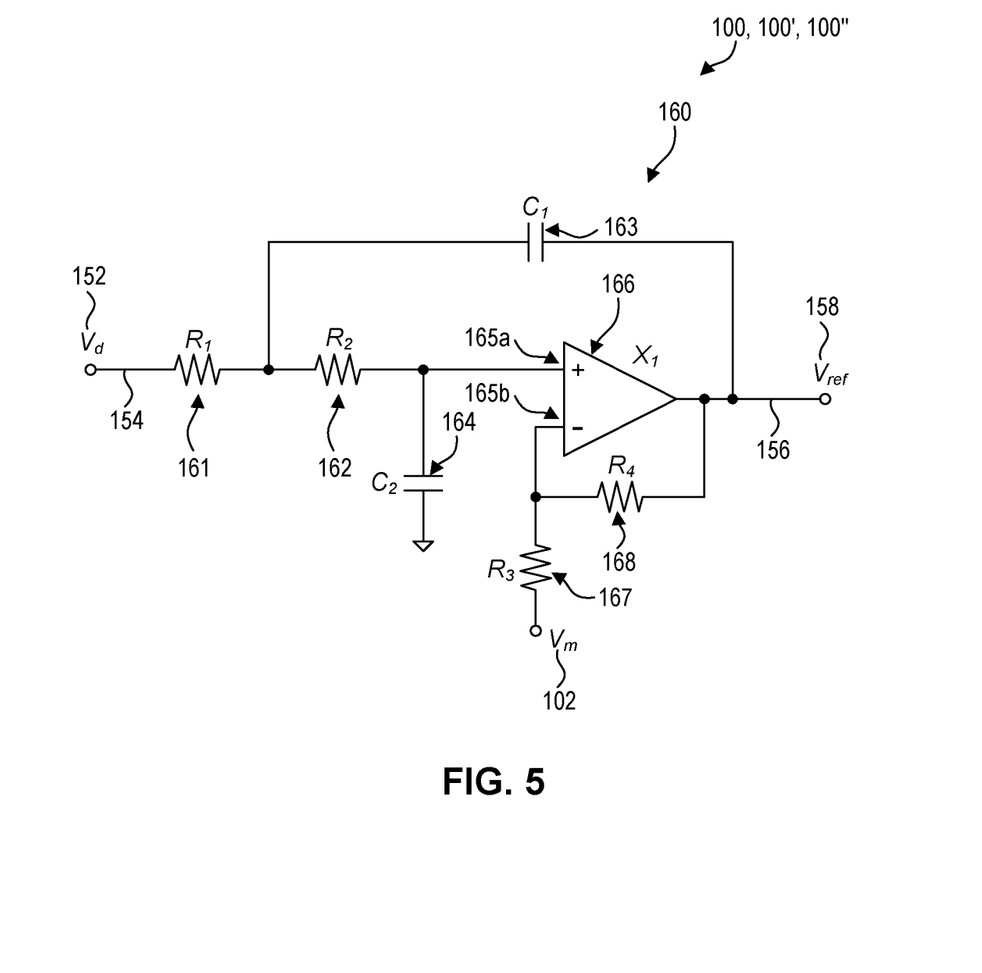
FIG. 5 is a schematic circuit diagram of a filter stage, according to an exemplary embodiment.

Filter stage 160 can be configured to receive filter stage input signal 154 from damping voltage node 152 based on damping voltage ($V_d$) 150. Filter stage 160 can be configured to adjust a phase and a gain of filter stage input signal 154 and output filter stage output signal 156 for damping reference voltage ($V_{ref}$) 158 in noise rejection stage 180. Filter stage 160 can be an electronic component or device (e.g., an operational amplifier). For example, filter stage 160 can be an electronic filter comprising one or more discrete electronic components (e.g., a resistor, a capacitor, an inductor, an operational amplifier, etc.). Filter stage 160 can be a high-impedance filter in order to maximize the noise rejection of electromechanical noise in noise rejection stage 180 for a frequency bandwidth of interest. Filter stage 160 can preserve the voltage ripples of damping voltage ($V_d$) 150 responsible for the electrostatic actuation of transducer 120 and resonator 110. Filter stage 160 can be configured to have about an infinite input impedance and about a zero output impedance. Filter stage 160 can be configured to sample filter stage input signal 154 based on damping voltage ($V_d$) 150 and pass damping reference voltage ($V_{ref}$) 158 (i.e., noise reference signal) to noise rejection stage 180. Filter stage 160 can be configured to have a high impedance in order to preserve damping voltage ($V_d$) 150. As shown in FIG. 1, filter stage 160 can be connected between damping voltage ($V_d$) 150 and noise rejection stage 180. In some embodiments, filter stage 160 can be a linear analog filter. For example, as shown in FIG. 5, filter stage 160 can include a Sallen-Key topology. In some embodiments, as shown in FIG. 5, filter stage 160 can include a Sallen-Key topology and be configured to have about an infinite input impedance and about a zero output impedance. For example, as shown in FIG. 5, resistor and capacitor values of filter stage 160 can be designed to result in a transfer function given by $$H(s) = \frac{V_{out}(s)}{V_{in}(s)} = \frac{K\omega_c^2}{s^2 + \frac{s\omega_C}{Q_c} + \omega_c^2},$$

where K=12.7, $Q_c$=3, $\omega_c$=2π$f_c$, and $f_c$=4.8 kHz. In some embodiments, filter stage output signal 156 can match a phase and a gain of sense capacitor signal 126 when damping switch 130 is open and sampling switch 140 is closed. For example, filter stage output signal 156 can match sampling current ($I_s$) 146 after it is converted to a voltage signal by analog front end 170.

Figure 2:
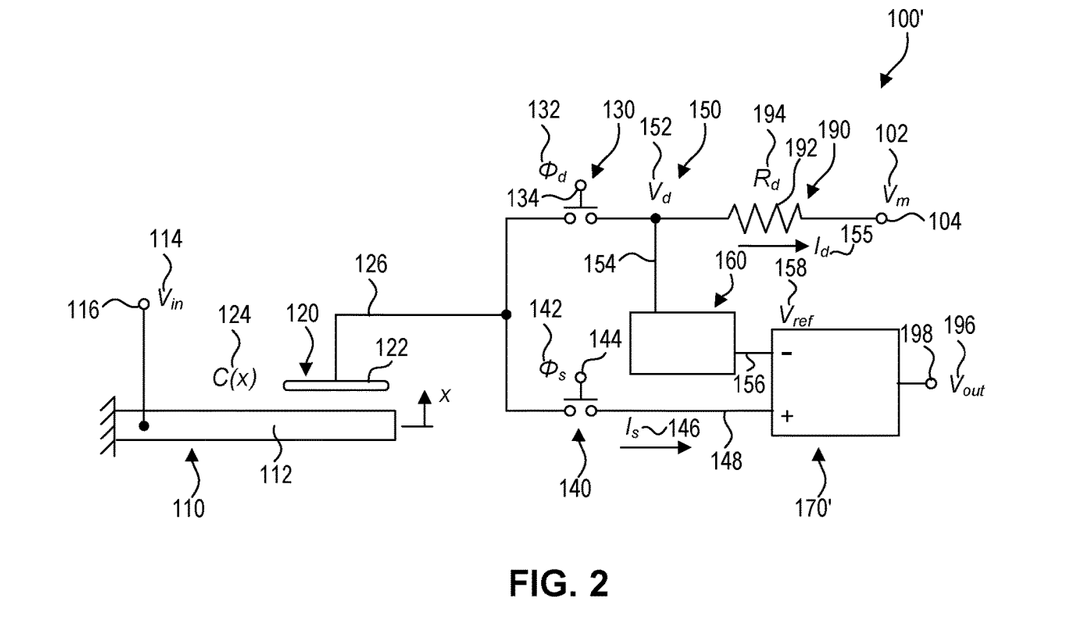
FIG. 2 is a schematic illustration and circuit diagram of a sensor apparatus, according to an exemplary embodiment.
Figure 3:
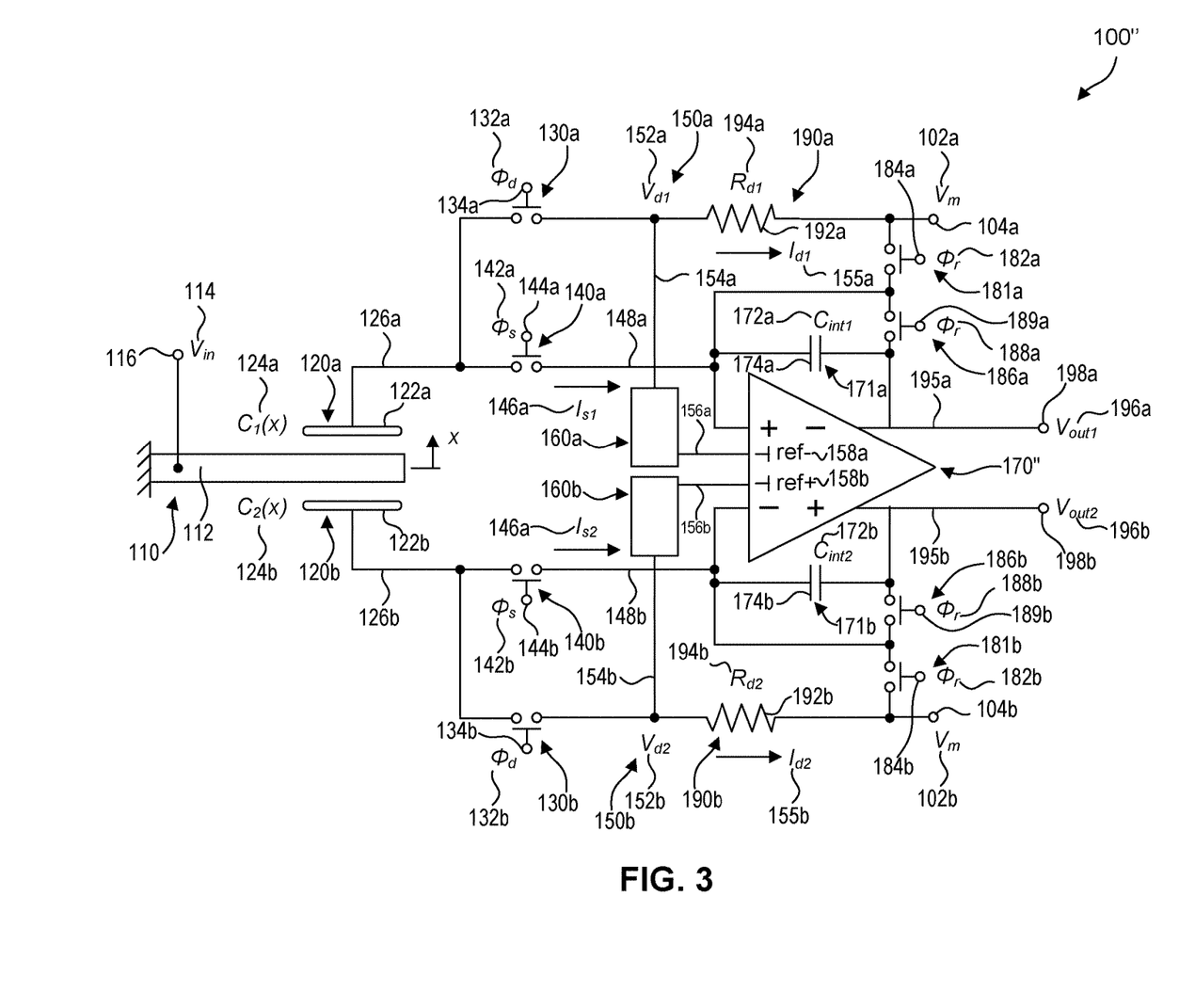
FIG. 3 is a schematic illustration and circuit diagram of a differential sensor system, according to an exemplary embodiment.

Analog front end (AFE) 170 can be configured to convert sampling current ($I_s$) 146 to a voltage signal and increase a gain of sampling current ($I_s$) 146. As shown in FIG. 1, AFE 170 can be connected between sampling switch 140 and noise rejection stage 180. AFE 170 can be an electronic component or device (e.g., an operational amplifier). For example, AFE 170 can include analog signal conditioning circuitry comprising one or more discrete electronic components (e.g., an operational amplifier, a filter, an ASIC, an interface sensor, etc.). In some embodiments, AFE 170 can include a transimpedance amplifier. In some embodiments, as shown in FIG. 2, AFE 170 can be combined with noise rejection stage 180. In some embodiments, AFE 170 can be a switched-capacitor integrator. For example, as shown in FIG. 3, differential noise rejection stage 170″ can include an analog front end, for example, AFE 170 which includes integrating capacitors 171a, 171b, reset switches 181a, 181b, and/or reset switches 186a, 186b.

Sensor apparatus 100 can operate in a damping phase or a sampling phase in some embodiments. During the damping phase, damping switch 130 can be activated by damping phase signal ($\Phi_d$) 132 in order to isolate the series RC network, including resonator 110, transducer 120, and damping resistor ($R_d$) 190. The damping phase can convert (i.e., change) thermomechanical noise of resonator 110 to electromechanical noise (i.e., shift thermomechanical noise of resonator 110 in the mechanical domain to electromechanical noise in the electrical domain). During the sampling phase, sampling switch 140 can be activated by sampling phase signal ($\Phi_s$) 142 in order to isolate a signal from resonator 110 containing electromechanical noise generated by damping resistor ($R_d$) 190. The sampling phase can measure the electromechanical noise of the resonator 110 in the electrical domain.

In a damping phase, damping switch 130 can be closed and sampling switch 140 can be open. A constant input voltage ($V_{in}$) 114 can be applied to resonator 110 and a constant common voltage ($V_m$) 102 can be applied to transducer 120 and damping resistor ($R_d$) 190. A voltage difference can be created between input voltage ($V_{in}$) 114 and common voltage ($V_m$) 102, such that damping resistor ($R_d$) 190 electrostatically actuates transducer 120 and converts (i.e., change) the thermomechanical noise of resonator 110 to an electromechanical noise (i.e., shift thermomechanical noise of resonator 110 in the mechanical domain to electromechanical noise in the electrical domain). Sense capacitor signal 126 at damping voltage node 152 can be fed through filter stage 160 and inputted into noise rejection stage 180 as damping reference voltage ($V_{ref}$) 158.

In a sampling phase, damping switch 130 can be open and sampling switch 140 can be closed. A pulse input voltage ($V_{in}$) 114 can be applied to resonator 110 to produce sampling current ($I_s$) 146. Sampling current ($I_s$) 146 can be proportional to a rate of change of pulse input voltage ($V_{in}$) 114 and an instantaneous value of sense capacitor 122 of transducer 120. Capacitance (C(x)) 124 of sense capacitor 122 can vary with proof-mass 112 displacement (i.e., a distance along X-axis). Sampling current ($I_s$) 146 can be correlated to voltage ripples (i.e., electromechanical noise) of damping voltage ($V_d$) 150. Electromechanical noise on sampling current ($I_s$) 146 can be correlated to (i.e., having a causal relationship with) electromechanical noise of damping voltage ($V_d$) 150 (i.e., electromechanical noise of sampling current ($I_s$) 146 can be dependent upon electromechanical noise of damping voltage ($V_d$) 150). Sampling current ($I_s$) 146 can be fed along sampling switch output signal 148 through AFE 170 and inputted into noise rejection stage 180 as AFE output signal 172.

Noise rejection stage 180 can be configured to reduce the electromechanical noise from output voltage ($V_{out}$) 196 at output voltage contact 198. Noise rejection stage 180 can be configured to receive damping reference voltage ($V_{ref}$) 158 from filter stage 160 and AFE output signal 172 from AFE 170. Noise rejection stage 180 can be operated as a feed-forward noise rejection stage. Noise rejection stage 180 can be an electronic component or device (e.g., an operational amplifier). For example, noise rejection stage 180 can be an electronic filter comprising one or more discrete electronic components (e.g., an operational amplifier, a filter, an analog front end, a resistor, a capacitor, a switch, etc.). Noise rejection stage 180 can receive damping reference voltage ($V_{ref}$) 158 (i.e., first input signal) during the damping phase and receive AFE output signal 172 (i.e., second input signal) during the sampling phase. Noise rejection stage 180 can be configured to reduce voltage ripples (i.e., electromechanical noise) of damping voltage ($V_d$) 150. For example, noise rejection stage 180 can reduce damping reference voltage ($V_{ref}$) 158 from output voltage ($V_{out}$) 196 at output voltage contact 198. For example, noise rejection stage 180 can subtract damping reference voltage ($V_{ref}$) 158 from AFE output signal 172. In some embodiments, noise rejection stage 180 can include AFE 170. For example, as shown in FIG. 2, noise rejection stage 170′ can include an analog front end, for example, AFE 170. For example, as shown in FIG. 2, noise rejection stage 170′ can include an analog front end, for example, AFE 170 in order to save space and power in sensor apparatus 100 or 100′. In some embodiments, noise rejection stage 180 can include a comparator operational amplifier (op-amp).

In some embodiments, electrostatic damping (i.e., damping phase) in sensor apparatus 100 can be time-multiplexed with a sensing operation (i.e., sampling phase) using a single transducer 120, for example, sense capacitor 122. In some embodiments, electrostatic damping (i.e., damping phase) in sensor apparatus 100 can be continuously applied and sensed with a first dedicated transducer, for example, similar to transducer 120, coupled to proof mass 112, and a sensing operation (i.e., sampling phase) in sensor apparatus 100 can be continuously applied and sensed with a second dedicated transducer, for example, similar to transducer 120, coupled to proof mass 112. For example, as shown in FIG. 3, first dedicated transducer (i.e., damping phase) can be transducer 120a and second dedicated transducer (i.e., sensing phase) can be transducer 120b. In some embodiments, filter stage 160, AFE 170, and noise rejection stage 180 can be closely matched in order to be temperature insensitive. For example, electrical components (e.g., resistors, capacitors, etc.) of filter stage 160, AFE 170, and noise rejection stage 180 can be chosen to have a similar temperature dependence.

FIG. 2 illustrates a schematic of sensor apparatus 100′, according to an exemplary embodiment. The embodiments of sensor apparatus 100 shown in FIG. 1 and the embodiments of sensor apparatus 100' shown in FIG. 2 are similar. Similar reference numbers are used to indicate similar features of the embodiments of sensor apparatus 100 shown in FIG. 1 and the similar features of the embodiments of sensor apparatus 100' shown in FIG. 2. Description of sensor apparatus 100' is omitted in the interest of brevity. One difference between the embodiments of sensor apparatus 100 shown in FIG. 1 and the embodiments of sensor apparatus 100' shown in FIG. 2 is that sensor apparatus 100' has noise rejection stage 170', which includes an analog front end, such as AFE 170 as shown in FIG. 1 and a noise rejection stage, such as noise rejection stage 180 as shown in FIG. 1, rather than separate AFE 170 and noise rejection stage 180 of sensor apparatus 100 shown in FIG. 1.

As shown in FIG. 2, noise rejection stage 170' can be connected between sampling switch 140 and output voltage contact 198 and between filter stage 160 and output voltage contact 198. Noise rejection stage 170' can be configured to reduce the electromechanical noise from output voltage ($V_{out}$) 196 at output voltage contact 198. Noise rejection stage 170' can be configured to receive damping reference voltage ($V_{ref}$) 158 from filter stage 160 and sampling switch output signal 148 from sampling switch 140. Noise rejection stage 170' can be operated as a feedforward noise rejection stage. Noise rejection stage 170' can receive damping reference voltage ($V_{ref}$) 158 (i.e., first input signal) during the damping phase and receive sampling switch output signal 148 (i.e., second input signal) during the sampling phase. Noise rejection stage 170' can be configured to reduce voltage ripples (i.e., electromechanical noise) of damping voltage ($V_d$) 150. For example, noise rejection stage 170' can reduce damping reference voltage ($V_{ref}$) 158 from output voltage ($V_{out}$) 196 at output voltage contact 198. For example, noise rejection stage 170' can subtract damping reference voltage ($V_{ref}$) 158 from sampling switch output signal 148. Noise rejection stage 170' can include an analog front end, for example, similar to AFE 170, in order to save space and power in sensor apparatus 100'.

In some embodiments, noise rejection stage 170' can include a comparator operational amplifier (op-amp). In some embodiments, noise rejection stage 170' can include a transimpedance amplifier. In some embodiments, noise rejection stage 170' can be a switched-capacitor integrator. For example, as shown in FIG. 3, differential noise rejection stage 170" can include an analog front end, for example, AFE 170, which includes integrating capacitors 171a, 171b, reset switches 181a, 181b, and/or reset switches 186a, 186b.

Exemplary Differential Sensor System

FIG. 3 illustrates a schematic of differential sensor system 100", according to an exemplary embodiment. The embodiments of sensor apparatus 100' shown in FIG. 2 and the embodiments of differential sensor system 100" shown in FIG. 3 are similar. Similar reference numbers are used to indicate similar features of the embodiments of sensor apparatus 100' shown in FIG. 2 and the similar features of the embodiments of differential sensor system 100" shown in FIG. 3. Detailed description of differential sensor system 100" is omitted in the interest of brevity. One difference between the embodiments of sensor apparatus 100' shown in FIG. 2 and the embodiments of differential sensor system 100" shown in FIG. 3 is that differential sensor system 100" is a differential version of sensor apparatus 100', which includes dual versions of sensor apparatus 100', including dual common voltages ($V_m$) 102a, 102b, dual transducers 120a, 120b with dual sense capacitance ($C_1(x)$, $C_2(x)$) 124a, 124b for coupling to resonator 110, dual damping switches 130a, 130b, dual sampling switches 140a, 140b, dual damping voltages ($V_{d1}$, $V_{d2}$) 150a, 150b, dual damping resistors ($R_{d1}$, $R_{d2}$) 190a, 190b, dual damping currents ($I_{d1}$, $I_{d2}$) 155a, 155b, dual sampling currents ($I_{s1}$, $I_{s2}$) 146a, 146b, dual sampling switch output signals 148a, 148b, dual filter stages 160a, 160b, dual damping reference voltages ($V_{ref-}$, $V_{ref+}$) 158a, 158b, and dual output voltages ($V_{out1}$, $V_{out2}$) 196a, 196b, respectively, and differential sensor system 100" has differential noise rejection stage 170", which includes an analog front end, such as AFE 170 as shown in FIG. 1, which includes integrating capacitors ($C_{int1}$, $C_{int2}$) 171a, 171b, reset switches 181a, 181b, and reset switches 186a, 186b.

As shown in FIG. 3, differential noise rejection stage 170" can be configured to operate as a switched-capacitor integrator. Transducer 120a can be configured to detect a first position (e.g., along "X-axis") of resonator 110. Transducer 120b can be configured to detect a second position (e.g., along "X-axis") of resonator 110. Damping resistor ($R_{d1}$) 190a can be configured to electrostatically actuate transducer 120a and convert a thermomechanical noise of resonator 110 to an electromechanical noise, which can be detected by transducer 120a. Damping resistor ($R_{d2}$) 190b can be configured to electrostatically actuate transducer 120b and convert the thermomechanical noise of resonator 110 to an electromechanical noise, which can be detected by transducer 120b. Damping switch 130a can be configured to receive sense capacitor signal 126a from transducer 120a. Filter stage 160a can be configured to receive filter stage input signal 154a from damping voltage node 152a based on damping voltage ($V_{d1}$) 150a. Filter stage 160a can be configured to adjust a phase and a gain of filter stage input signal 154a and output filter stage output signal 156a for damping reference voltage ($V_{ref-}$) 158a in differential noise rejection stage 170". Sampling switch 140a can be configured to receive sense capacitor signal 126a from transducer 120a. Damping switch 130b can be configured to receive sense capacitor signal 126b from transducer 120b. Filter stage 160b can be configured to receive filter stage input signal 154b from damping voltage node 152b based on damping voltage ($V_{d2}$) 150b. Filter stage 160b can be configured to adjust a phase and a gain of filter stage input signal 154b and output filter stage output signal 156b for damping reference voltage ($V_{ref+}$) 158b in differential noise rejection stage 170". Sampling switch 140b can be configured to receive sense capacitor signal 126b from transducer 120b. Differential noise rejection stage 170" can be configured to receive damping reference voltage ($V_{ref-}$) 158a, sampling switch output signal 148a based on sampling current ($I_{s1}$) 146a, damping reference voltage ($V_{ref+}$) 158b, and sampling switch output signal 148b based on sampling current ($I_{s2}$) 146b. Differential noise rejection stage 170" can be configured to reduce a differential value (i.e., $V_{d1}-V_{d2}$) between damping reference voltage ($V_{ref-}$) 158a and damping reference voltage ($V_{ref+}$) 158b from a differential value (i.e., $I_{s1}-I_{s2}$) between sampling switch output signal 148a based on sampling current ($I_{s1}$) 146a and sampling switch output signal 148b based on sampling current ($I_{s2}$) 146b. Electromechanical noise on $V_{d1}-V_{d2}$ is correlated to $I_{s1}-I_{s2}$, and can be reduced or subtracted out by differential noise rejection stage 170".

As shown in FIG. 3, differential noise rejection stage 170" can be connected between sampling switches 140a, 140b and output voltage contacts 198a, 198b and between filter stages 160a, 160b and output voltage contacts 198a, 198b, respectively. Differential noise rejection stage 170" can be configured to reduce the electromechanical noise from output voltages ($V_{out1}$, $V_{out2}$) 196a, 196b at output voltage contacts 198a, 198b. Differential noise rejection stage 170" can be configured to receive damping reference voltages ($V_{ref-}$, $V_{ref+}$) 158a, 158b from filter stages 160a, 160b and sampling switch output signals 148a, 148b from sampling switches 140a, 140b, respectively. Differential noise rejection stage 170" can be operated as a feedforward noise rejection stage. Differential noise rejection stage 170" can receive damping reference voltages ($V_{ref-}$, $V_{ref+}$) 158a, 158b during the damping phase and receive sampling switch output signals 148a, 148b during the sampling phase. Differential noise rejection stage 170" can be configured to reduce voltage ripples (i.e., electromechanical noise) of damping voltages ($V_{d1}$, $V_{d2}$) 150a, 150b. For example, differential noise rejection stage 170" can reduce damping reference voltages ($V_{ref-}$, $V_{ref+}$) 158a, 158b from output voltages ($V_{out1}$, $V_{out2}$) 196a, 196b at output voltage contacts 198a, 198b. For example, differential noise rejection stage 170" can subtract damping reference voltages ($V_{ref-}$, $V_{ref+}$) 158a, 158b from sampling switch output signals 148a, 148b, respectively. Differential noise rejection stage 170" can include an analog front end, for example, similar to AFE 170, in order to save space and power in differential sensor system 100". In some embodiments, differential noise rejection stage 170" can include a comparator operational amplifier (op-amp). In some embodiments, differential noise rejection stage 170" can include a transimpedance amplifier.

As shown in FIG. 3, differential noise rejection stage 170" can include integrating capacitors ($C_{int1}$, $C_{int2}$) 171a, 171b, reset switches 181a, 181b, reset switches 186a, 186b, and output signals 195a, 195b, respectively. Integrating capacitors ($C_{int1}$, $C_{int2}$) 171a, 171b can be configured to operate as switched-capacitor resistors to provide large resistances to provide sufficient electrostatic damping on proof mass 112 via transducers 120a, 120b, respectively. Integrating capacitor ($C_{int1}$) 171a can be connected between reset switch 181a and reset switch 186a and between sampling switch output signal 148a and output signal 195a. Integrating capacitor ($C_{int1}$) 171a can include capacitor 174a with capacitance ($C_{int1}$) 172a. Integrating capacitor ($C_{int2}$) 171b can be connected between reset switch 181b and reset switch 186b and between sampling switch output signal 148b and output signal 195b. Integrating capacitor ($C_{int2}$) 171b can include capacitor 174b with capacitance ($C_{int2}$) 172b.

Reset switches 181a, 186a can be configured to reset a charge on integrating capacitor ($C_{int1}$) 171a. Reset switch 181a can include reset phase signal ($\Phi_r$) 182a and reset switch contact 184a. Reset switch 186a can include reset phase signal ($\Phi_r$) 188a and reset switch contact 189a. Reset switches 181a, 186a can be configured to open or close an electrical pathway between integrating capacitor ($C_{int1}$) 171a and damping resistor ($R_{d1}$) 190a. Reset switches 181a, 186a can be controlled by reset phase signal ($\Phi_r$) 182a, 188a, respectively. Reset switches 181a, 186a can be considered open when reset phase signal ($\Phi_r$) 182a, 188a is a logic LOW voltage, respectively. Reset switches 181a, 186a can be considered closed when reset phase signal ($\Phi_r$) 182a, 188a is a logic HIGH voltage, respectively. Reset phase signal ($\Phi_r$) 182a, 188a can be triggered by a drive-synchronized signal, delayed by a desired amount. In some embodiments, reset phase signal ($\Phi_r$) 182a, 188a can be a binary electrical signal. For example, as shown in FIG. 6, reset phase signal ($\Phi_r$) 182a, 188a can be a transistor-transistor logic (TTL) signal. In some embodiments, reset phase signal ($\Phi_r$) 182a, 188a can be equal to reset phase signal ($\Phi_r$) 182, 188. In some embodiments, reset phase signal ($\Phi_r$) 182b, 188b can be equal to damping phase signal ($\Phi_d$) 132.

Reset switches 181b, 186b can be configured to reset a charge on integrating capacitor ($C_{int2}$) 171b. Reset switch 181b can include reset phase signal ($\Phi_r$) 182b and reset switch contact 184b. Reset switch 186b can include reset phase signal ($\Phi_r$) 188b and reset switch contact 189b. Reset switches 181b, 186b can be configured to open or close an electrical pathway between integrating capacitor ($C_{int2}$) 171b and damping resistor ($R_{d2}$) 190b. Reset switches 181b, 186b can be controlled by reset phase signal ($\Phi_r$) 182b, 188b, respectively. Reset switches 181b, 186b can be considered open when reset phase signal ($\Phi_r$) 182b, 188b is a logic LOW voltage, respectively. Reset switches 181b, 186b can be considered closed when reset phase signal ($\Phi_r$) 182b, 188b is a logic HIGH voltage, respectively. Reset phase signal ($\Phi_r$) 182b, 188b can be triggered by a drive-synchronized signal, delayed by a desired amount. In some embodiments, reset phase signal ($\Phi_r$) 182b, 188b can be a binary electrical signal. For example, as shown in FIG. 6, reset phase signal ($\Phi_r$) 182b, 188b can be a transistor-transistor logic (TTL) signal. In some embodiments, reset phase signal ($\Phi_r$) 182b, 188b can be equal to reset phase signal ($\Phi_r$) 182, 188. In some embodiments, reset phase signal ($\Phi_r$) 182b, 188b can be equal to damping phase signal ($\Phi_d$) 132.

Figure 7:
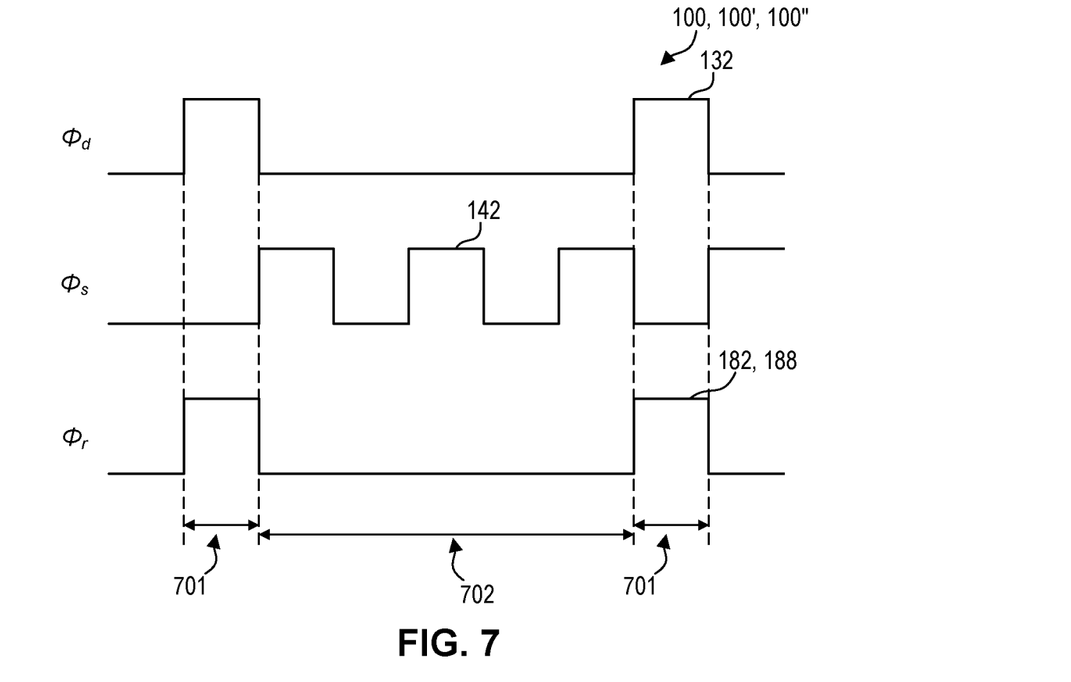
FIG. 7 is a schematic illustration of a time-multiplexed operation of a damping phase signal, a sampling phase signal, and a reset phase signal, according to an exemplary embodiment.

As shown in FIGS. 3, 6, and 7, differential sensor system 100" can employ a time-multiplexed differential noise-rejecting analog front end (i.e., differential noise rejection stage 170"). Differential sensor system 100" can utilize damping phase signal ($\Phi_d$) 132, sampling phase signal ($\Phi_s$) 142, and reset phase signal ($\Phi_r$) 182, 188 each defining a damping phase, a sampling phase, and a reset phase, respectively. Damping and sampling phases can be engaged in a multiplexed fashion such that their ON-states (i.e., logic HIGH voltage) are mutually exclusive. For example, as shown in FIG. 6, damping phase 601 and sampling phase 602 can alternate over time. Reset phase can be engaged when not in the sampling phase in order to reset the charge on integrating capacitors ($C_{int1}$, $C_{int2}$) 171a, 171b. In some embodiments, reset phase can coincide with damping phase. For example, as shown in FIG. 6, reset phase can coincide with damping phase 601. Differential noise rejection stage 170" can be configured to receive damping reference voltage ($V_{ref-}$) 158a and damping reference voltage ($V_{ref+}$) 158b. Within differential noise rejection stage 170", sampling switch output signal 148a based on sampling current ($I_{s1}$) 146a and sampling switch output signal 148b based on sampling current ($I_{s2}$) 146b are referenced to a common-mode signal (e.g., common voltages ($V_m$) 102a, 102b) which includes a component proportional to the difference of damping reference voltages ($V_{ref-}$, $V_{ref+}$) 158a, 158b (i.e., $V_{ref-} - V_{ref+}$). The common-mode signal can be shifted in phase to maximize noise rejection at frequencies within the bandwidth of differential sensor system 100".

In a damping phase, damping switches 130a, 130b can be closed, sampling switches 140a, 140b can be open, and reset switches 181a, 186a, 181b, 186b can be closed. A constant input voltage ($V_{in}$) 114 can be applied to resonator 110 and constant common voltages ($V_m$) 102a, 102b can be applied to transducers 120a, 120b and damping resistors ($R_{d1}$, $R_{d2}$) 190a, 190b, respectively. A voltage difference can be created between input voltage ($V_{in}$) 114 and common voltages ($V_m$) 102a, 102b, such that biases can be produced across the RC networks ($R_{d1}C_1(x)$) formed by damping resistor ($R_{d1}$) 190a and transducer 120a and ($R_{d2}C_2(x)$) formed by damping resistor ($R_{d2}$) 190b and transducer 120b, and damping resistors ($R_{d1}$, $R_{d2}$) 190a, 190b actuate transducers 120a, 120b and convert the thermomechanical noise of resonator 110 to an electromechanical noise, respectively. These biases, along with proof-mass 112 velocity (i.e., dx/dt), cause damping currents ($I_{d1}$, $I_{d2}$) 155a, 155b that are directed through damping resistors ($R_{d1}$, $R_{d2}$) 190a, 190b and produce voltage ripples on damping voltages ($V_{d1}$, $V_{d2}$) 150a, 150b, respectively. The voltage ripples produce damping forces on proof-mass 112 via electrostatic actuation with sense capacitors 122a, 122b. This electrostatic actuation also produces unwanted mechanical noise on proof-mass 112 that is sensed during the sampling phase. Sense capacitor signals 126a, 126b at damping voltage nodes 152a, 152b can be fed through filter stages 160a, 160b and inputted into differential noise rejection stage 170" as damping reference voltages ($V_{ref-}$, $V_{ref+}$) 158a, 158b, respectively.

In a sampling phase, damping switches 130a, 130b can be open, sampling switches 140a, 140b can be closed, and reset switches 181a, 186a, 181b, 186b can be open. A pulse input voltage ($V_{in}$) 114 can be applied to resonator 110 to produce sampling currents ($I_{s1}$, $I_{s2}$) 146a, 146b. Sampling currents ($I_{s1}$, $I_{s2}$) 146a, 146b can be proportional to a rate of change of pulse input voltage ($V_{in}$) 114 and instantaneous values of sense capacitors 122a, 122b of transducers 120a, 120b, respectively. Capacitances ($C_1(x)$, $C_2(x)$) 124a, 124b of sense capacitors 122a, 122b can vary with proof-mass 112 displacement (i.e., a distance along X-axis), respectively. With sampling switches 140a, 140b closed (i.e., sampling phase signal ($\Phi_s$) 142 is logic HIGH), sampling currents ($I_{s1}$, $I_{s2}$) 146a, 146b are fed to integrating capacitors ($C_{int1}$, $C_{int2}$) 171a, 171b, respectively, which integrates sampling currents ($I_{s1}$, $I_{s2}$) 146a, 146b during a short time spanning the pulse input voltage ($V_{in}$) 114. At the end of the integration, output voltages ($V_{out1}$, $V_{out2}$) 195a, 195b are proportional to the charge on sense capacitors 122a, 122b generated by the pulse input voltage ($V_{in}$) 114, respectively. Since the charge is proportional to the capacitance and the capacitance is proportional to the displacement, output voltages ($V_{out1}$, $V_{out2}$) 195a, 195b are proportional to the displacement of proof-mass 112. Sampling currents ($I_{s1}$, $I_{s2}$) 146a, 146b can be correlated to voltage ripples (i.e., electromechanical noise) of damping voltages ($V_{d1}$, $V_{d2}$) 150a, 150b, respectively. Electromechanical noise on sampling currents ($I_{s1}$, $I_{s2}$) 146a, 146b can be correlated to electromechanical noise of damping voltages ($V_{d1}$, $V_{d2}$) 150a, 150b, respectively. Sampling currents ($I_{s1}$, $I_{s2}$) 146a, 146b can be fed along sampling switch output signals 148a, 148b and inputted into differential noise rejection stage 170". Electromechanical noise on a differential value (i.e., $V_{d1}-V_{d2}$) between damping reference voltage ($V_{ref-}$) 158a and damping reference voltage ($V_{ref+}$) 158b is correlated to a differential value (i.e., $I_{s1}-I_{s2}$) between sampling switch output signal 148a based on sampling current ($I_{s1}$) 146a and sampling switch output signal 148b based on sampling current ($I_{s2}$) 146b, and can be reduced or subtracted out by differential noise rejection stage 170".

In some embodiments, electrostatic damping can be time-multiplexed as long as the multiplexing frequency (i.e., rate) is sufficiently far above the mechanical resonant frequency ($\omega_0$) of resonator 110. For example, for a mechanical resonant frequency ($\omega_0$) of 4 kHz, the multiplexing frequency can be at least a decade faster than 4 kHz (i.e., 40 kHz). In some embodiments, for time-multiplexed damping, the damping magnitude (i.e., damping voltage ($V_d$) 150) can be proportional to the duty-cycle of the damping phase (i.e., damping phase signal ($\Phi_d$) 132). In some embodiments, damping phase can be multiplexed by damping phase signal ($\Phi_d$) 132 at a frequency of about 10 kHz to about 100 kHz. For example, damping phase signal ($\Phi_d$) 132 can have a frequency of about 30 kHz to about 60 kHz. In some embodiments, sampling phase can be multiplexed by sampling phase signal ($\Phi_s$) 142 at a frequency of about 10 kHz to about 100 kHz. For example, sampling phase signal ($\Phi_s$) 142 can have a frequency of about 30 kHz to about 60 kHz. In some embodiments, damping phase can be multiplexed by reset phase signal ($\Phi_r$) 182, 188 at a frequency of about 10 kHz to about 100 kHz. For example, reset phase signal ($\Phi_r$) 182, 188 can have a frequency of about 30 kHz to about 60 kHz.

Exemplary Filter Stage

Figure 4:
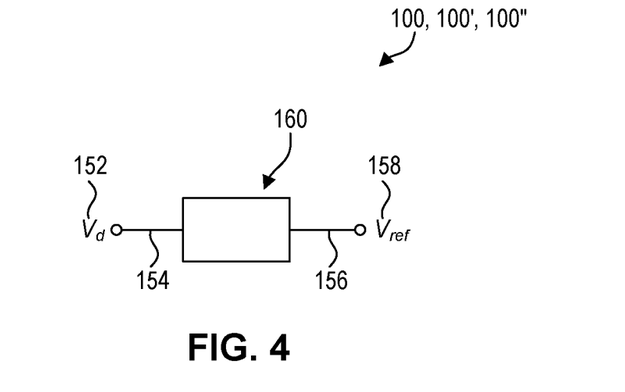
FIG. 4 is a schematic circuit diagram of a filter stage, according to an exemplary embodiment.

FIG. 4 illustrates a schematic circuit diagram of filter stage 160, according to an exemplary embodiment. FIG. 5 illustrates a schematic circuit diagram of filter stage 160, according to an exemplary embodiment. The embodiments of filter stage 160 shown in FIGS. 4 and 5 can be implemented in the embodiments of sensor apparatus 100, sensor apparatus 100', or differential sensor system 100".

The embodiments of filter stage 160 shown in FIGS. 1-3 and the embodiments of filter stage 160 shown in FIGS. 4 and 5 are similar. Similar reference numbers are used to indicate similar features of the embodiments of filter stage 160 shown in FIGS. 1-3 and the similar features of the embodiments of filter stage 160 shown in FIGS. 4 and 5.

As shown in FIGS. 4 and 5, filter stage 160 can be configured to receive filter stage input signal 154 from damping voltage node ($V_d$) 152 and output filter stage output signal 156 with damping reference voltage ($V_{ref}$) 158. Filter stage 160 can be configured to adjust a phase and a gain of filter stage input signal 154 and output filter stage output signal 156 for damping reference voltage ($V_{ref}$) 158. Filter stage 160 can be a high-impedance filter in order to maximize the noise rejection of electromechanical noise for a frequency bandwidth of interest. Filter stage 160 can preserve the voltage ripples responsible for electrostatic actuation. Filter stage 160 can be configured to have about an infinite input impedance and about a zero output impedance. Filter stage 160 can be configured to sample filter stage input signal 154 and pass damping reference voltage ($V_{ref}$) 158 (i.e., noise reference signal). Filter stage 160 can be configured to have a high impedance in order to preserve filter stage input signal 154 from damping voltage node ($V_d$) 152. In some embodiments, filter stage 160 can be a linear analog filter.

As shown in FIG. 5, filter stage 160 can include a Sallen-Key topology. Filter stage 160 can include first filter resistor ($R_1$) 161, second filter resistor ($R_2$) 162, first filter capacitor ($C_1$) 163, second filter capacitor ($C_2$) 164, first op-amp input signal 165a, second op-amp input signal 165b, op-amp ($X_1$) 166, third filter resistor ($R_3$) 167, and fourth filter resistor ($R_4$) 168. Resistors ($R_1$, $R_2$, $R_3$, $R_4$) 161, 162, 167, 168 and capacitors ($C_1$, $C_2$) 163, 164 of filter stage 160 can be designed to result in a transfer function given by $$H(s) = \frac{V_{out}(s)}{V_{in}(s)} = \frac{K\omega_c^2}{s^2 + \frac{s\omega_C}{Q_c} + \omega_c^2},$$

where K=12.7, $Q_c$=3, $\omega_c$=2$\pi f_c$, and $f_c$=4.8 kHz. In some embodiments, op-amp ($X_1$) 166 can be an integrator. In some embodiments, op-amp ($X_1$) 166 can be a comparator. In some embodiments, op-amp ($X_1$) 166 can be a differentiator. In some embodiments, op-amp ($X_1$) 166 can be a transimpedance amplifier.

Exemplary Time-Multiplexing

FIG. 6 illustrates a schematic time-multiplexed operation of damping phase signal ($\Phi_d$) 132, sampling phase signal ($\Phi_s$) 142, and reset phase signal ($\Phi_r$) 182, 188, according to an exemplary embodiment. The embodiments of damping phase signal ($\Phi_d$) 132, sampling phase signal ($\Phi_s$) 142, and reset phase signal ($\Phi_r$) 182, 188 shown in FIG. 6 can be implemented in sensor apparatus 100, sensor apparatus 100', or differential sensor system 100".

The embodiments of damping phase signal ($\Phi_d$) 132, sampling phase signal ($\Phi_s$) 142, and reset phase signal ($\Phi_r$) 182, 188 shown in FIGS. 1-3 and the embodiments of damping phase signal ($\Phi_d$) 132, sampling phase signal ($\Phi_s$) 142, and reset phase signal ($\Phi_r$) 182, 188 shown in FIG. 6 are similar. Similar reference numbers are used to indicate similar features of the embodiments of damping phase signal ($\Phi_d$) 132, sampling phase signal ($\Phi_s$) 142, and reset phase signal ($\Phi_r$) 182, 188 shown in FIGS. 1-3 and the similar features of the embodiments of damping phase signal ($\Phi_d$) 132, sampling phase signal ($\Phi_s$) 142, and reset phase signal ($\Phi_r$) 182, 188 shown in FIG. 6.

As shown in FIG. 6, the time-multiplexed operation of damping phase signal ($\Phi_d$) 132, sampling phase signal ($\Phi_s$) 142, and reset phase signal ($\Phi_r$) 182, 188 includes damping phase 601 and sampling phase 602 with a 1:1 matching (i.e., mutually exclusive alternating single logic HIGH voltage pulse of damping phase signal ($\Phi_d$) 132 and single logic HIGH voltage pulse of sampling phase signal ($\Phi_s$) 142). Damping phase signal ($\Phi_d$) 132, sampling phase signal ($\Phi_s$) 142, and/or reset phase signal ($\Phi_r$) 182, 188 can be triggered by a drive-synchronized signal, delayed by a desired amount. Damping phase signal ($\Phi_d$) 132, sampling phase signal ($\Phi_s$) 142, and/or reset phase signal ($\Phi_r$) 182, 188 can be a binary electrical signal. For example, as shown in FIG. 6, damping phase signal ($\Phi_d$) 132, sampling phase signal ($\Phi_s$) 142, and reset phase signal (or) 182, 188 can be a transistor-transistor logic (TTL) signal.

In some embodiments, damping phase 601 can include reset phase. For example, as shown in FIG. 6, reset phase signal ($\Phi_r$) 182, 188 can equal damping phase signal ($\Phi_d$) 132. In some embodiments, reset phase signal (O) 182, 188 can equal reset phase signal ($\Phi_r$) 182a, 188a, 182b, 188b. In some embodiments, damping phase signal ($\Phi_d$) 132, sampling phase signal ($\Phi_s$) 142, and/or reset phase signal (or) 182, 188 can be a sloped electrical signal. For example, damping phase signal ($\Phi_d$) 132, sampling phase signal ($\Phi_s$) 142, and/or reset phase signal ($\Phi_r$) 182, 188 can be an electrical signal with a low level (i.e., logic LOW voltage), a high level (i.e., logic HIGH voltage), a sloped rising edge over a first time span (i.e., between transition from logic LOW voltage to logic HIGH voltage), and a sloped falling edge over a second time span (i.e., between transition from logic HIGH voltage to logic LOW voltage).

FIG. 7 illustrates a schematic time-multiplexed operation of damping phase signal ($\Phi_d$) 132, sampling phase signal ($\Phi_s$) 142, and reset phase signal ($\Phi_r$) 182, 188, according to an exemplary embodiment. The embodiments of damping phase signal ($\Phi_d$) 132, sampling phase signal ($\Phi_s$) 142, and reset phase signal ($\Phi_r$) 182, 188 shown in FIG. 7 can be implemented in sensor apparatus 100, sensor apparatus 100', or differential sensor system 100".

The embodiments of damping phase signal ($\Phi_d$) 132, sampling phase signal ($\Phi_s$) 142, and reset phase signal ($\Phi_r$) 182, 188 shown in FIGS. 1-3 and the embodiments of damping phase signal ($\Phi_d$) 132, sampling phase signal ($\Phi_s$) 142, and reset phase signal ($\Phi_r$) 182, 188 shown in FIG. 7 are similar. Similar reference numbers are used to indicate similar features of the embodiments of damping phase signal ($\Phi_d$) 132, sampling phase signal ($\Phi_s$) 142, and reset phase signal ($\Phi_r$) 182, 188 shown in FIGS. 1-3 and the similar features of the embodiments of damping phase signal ($\Phi_d$) 132, sampling phase signal ($\Phi_s$) 142, and reset phase signal ($\Phi_r$) 182, 188 shown in FIG. 7.

As shown in FIG. 7, the time-multiplexed operation of damping phase signal ($\Phi_d$) 132, sampling phase signal ($\Phi_s$) 142, and reset phase signal ($\Phi_r$) 182, 188 includes damping phase 701 and sampling phase 702 with a 1:3 matching (i.e., mutually exclusive alternating single logic HIGH voltage pulse of damping phase signal ($\Phi_d$) 132 and three logic HIGH voltage pulses of sampling phase signal ($\Phi_s$) 142). Damping phase signal ($\Phi_d$) 132, sampling phase signal ($\Phi_s$) 142, and/or reset phase signal ($\Phi_r$) 182, 188 can be triggered by a drive-synchronized signal, delayed by a desired amount. Damping phase signal ($\Phi_d$) 132, sampling phase signal ($\Phi_s$) 142, and/or reset phase signal ($\Phi_r$) 182, 188 can be a binary electrical signal. For example, as shown in FIG. 6, damping phase signal ($\Phi_d$) 132, sampling phase signal ($\Phi_s$) 142, and reset phase signal ($\Phi_r$) 182, 188 can be a transistor-transistor logic (TTL) signal.

In some embodiments, damping phase 601 can include reset phase. For example, as shown in FIG. 7, reset phase signal ($\Phi_r$) 182, 188 can equal damping phase signal ($\Phi_d$) 132. In some embodiments, reset phase signal ($\Phi_r$) 182, 188 can equal reset phase signal ($\Phi_r$) 182a, 188a, 182b, 188b. In some embodiments, damping phase signal ($\Phi_d$) 132, sampling phase signal ($\Phi_s$) 142, and/or reset phase signal (o) 182, 188 can be a sloped electrical signal. For example, damping phase signal ($\Phi_d$) 132, sampling phase signal ($\Phi_s$) 142, and/or reset phase signal ($\Phi_r$) 182, 188 can be an electrical signal with a low level (i.e., logic LOW voltage), a high level (i.e., logic HIGH voltage), a sloped rising edge over a first time span (i.e., between transition from logic LOW voltage to logic HIGH voltage), and a sloped falling edge over a second time span (i.e., between transition from logic HIGH voltage to logic LOW voltage). In some embodiments, the three logic HIGH voltage pulses of sampling phase signal ($\Phi_s$) 142 can be used to calculate an average or median value of output voltage ($V_{out}$) 196. In some embodiments, damping phase 701 and sampling phase 702 can have a 1:2 matching, a 1:3 matching, a 1:4 matching, a 1:5 matching, or a 1:10 matching.

Exemplary Flow Diagram

Figure 8:
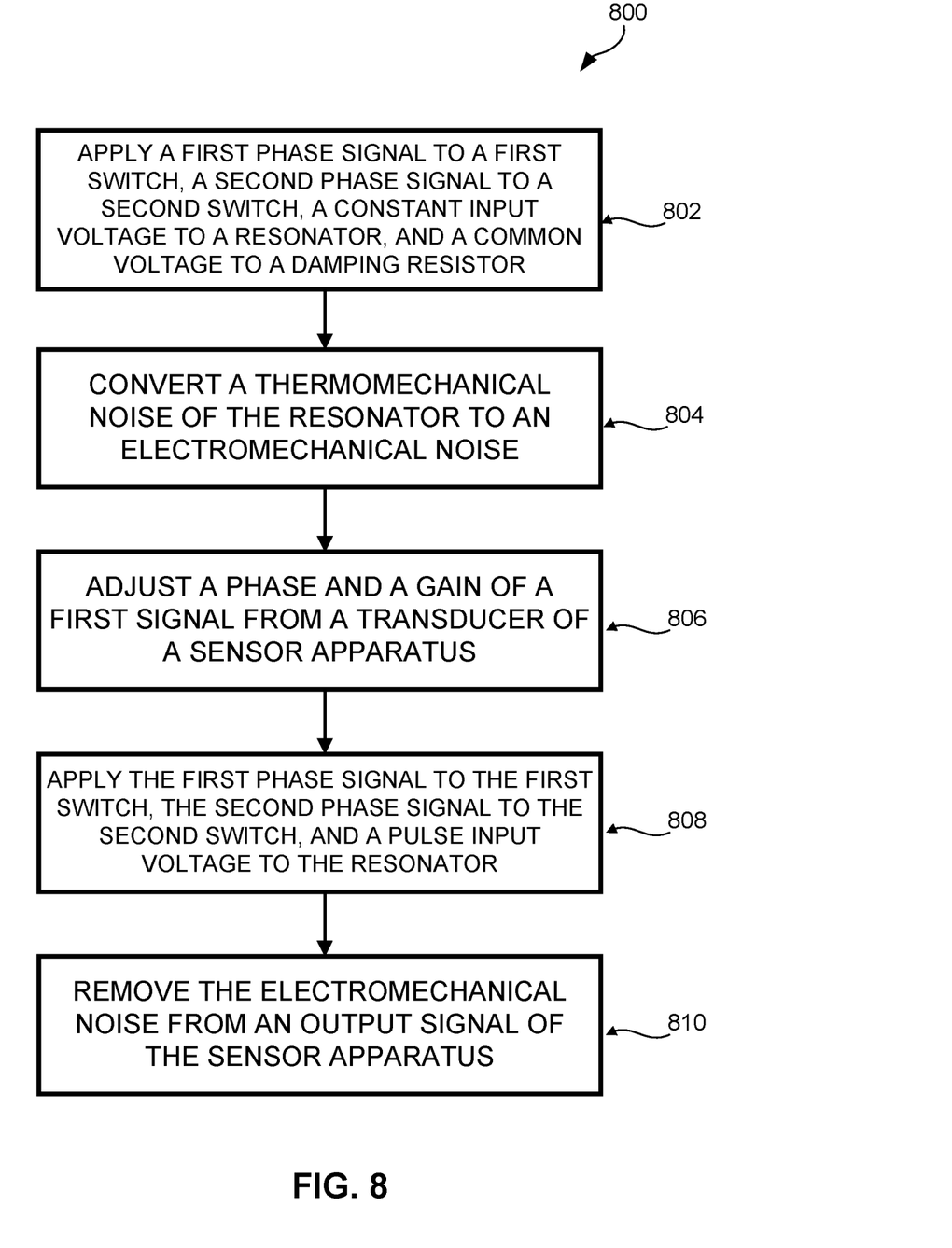
FIG. 8 illustrates a flow diagram for a sensor apparatus, according to an exemplary embodiment.

FIG. 8 illustrates flow diagram 800 for reducing thermo-mechanical noise in a sensor apparatus while maintaining a flat frequency response, according to an embodiment. It is to be appreciated that not all steps in FIG. 8 are needed to perform the disclosure provided herein. Further, some of the steps can be performed simultaneously, or in a different order than shown in FIG. 8. The embodiments of flow diagram 800 shown in FIG. 8 can be implemented in sensor apparatus 100, sensor apparatus 100', or differential sensor system 100". Flow diagram 800 shall be described with reference to FIGS. 1-3 and 6. However, flow diagram 800 is not limited to those example embodiments.

In step 802, as shown in the example of FIGS. 1-3 and 6, damping phase signal ($\Phi_d$) 132 can be applied to damping switch 130 of sensor apparatus 100, sensor apparatus 100', or differential sensor system 100" to close damping switch 130, sampling phase signal ($\Phi_s$) 142 can be applied to sampling switch 140 to open sampling switch 140, and a voltage difference can be applied between a constant input voltage ($V_{in}$) 114 applied to resonator 110 and a constant common voltage ($V_m$) 102 applied to damping resistor ($R_d$)

190 of sensor apparatus 100, sensor apparatus 100', or differential sensor system 100".

In step 804, as shown in the example of FIGS. 1-3 and 6, thermomechanical noise of resonator 110 can be converted to an electromechanical noise.

In step 806, as shown in the example of FIGS. 1-3 and 6, a phase and a gain of sense capacitor signal 126 of transducer 120 of sensor apparatus 100, sensor apparatus 100', or differential sensor system 100" at damping voltage node 152 can be adjusted. The phase and gain of sense capacitor signal 126 can be adjusted by filter stage 160 to output damping reference voltage ($V_{ref}$) 158.

In step 808, as shown in the example of FIGS. 1-3 and 6, damping phase signal ($\Phi_d$) 132 can be applied to damping switch 130 to open damping switch 130, sampling phase signal ($\Phi_s$) 142 can be applied to sampling switch 140 to close sampling switch 140, and a pulse input voltage ($V_{in}$) 114 can be applied to resonator 110 to produce sampling current ($I_s$) 146 from transducer 120. Sampling current ($I_s$) 146 can be fed along sampling switch output signal 148 and is correlated to voltage ripples (i.e., electromechanical noise) of damping voltage ($V_d$) 150. Electromechanical noise on sampling current ($I_s$) 146 can be correlated to electromechanical noise of damping voltage ($V_d$) 150.

In step 810, as shown in the example of FIGS. 1-3 and 6, electromechanical noise can be reduced from output voltage ($V_{out}$) 196.

In some embodiments, flow diagram 800 further includes filtering sense capacitor signal 126 at damping voltage node 152 with a Sallen-Key topology to match a phase and a gain of sampling switch output signal 148. For example, as shown in FIG. 5, filter stage 160 can include a Sallen-Key topology and filter stage output signal 156 can match a phase and a gain of sampling current ($I_s$) 146 after it is converted to a voltage signal by an analog front end (e.g., AFE 170, noise rejection stage 170', differential noise rejection stage 170"). In some embodiments, the reducing includes subtracting damping reference voltage ($V_{ref}$) 158 from sampling switch output signal 148. For example, as shown in FIG. 3, differential noise rejection stage 170" can subtract damping reference voltages ($V_{ref-}$, $V_{ref+}$) 158a, 158b from sampling switch output signals 148a, 148b.

In some embodiments, noise rejection stage 180 can be configured to remove the electromechanical noise from output voltage ($V_{out}$) 196 at output voltage contact 198. In some embodiments, noise rejection stage 180 can be configured to remove voltage ripples (i.e., electromechanical noise) of damping voltage ($V_d$) 150. For example, noise rejection stage 180 can remove damping reference voltage ($V_{ref}$) 158 from output voltage ($V_{out}$) 196 at output voltage contact 198.

In some embodiments, noise rejection stage 170' can be configured to remove the electromechanical noise from output voltage ($V_{out}$) 196 at output voltage contact 198. In some embodiments, noise rejection stage 170' can be configured to remove voltage ripples (i.e., electromechanical noise) of damping voltage ($V_d$) 150. For example, noise rejection stage 170' can remove damping reference voltage ($V_{ref}$) 158 from output voltage ($V_{out}$) 196 at output voltage contact 198.

In some embodiments, differential noise rejection stage 170" can be configured to remove a differential value (i.e., $V_{d1}-V_{d2}$) between damping reference voltage ($V_{ref-}$) 158a and damping reference voltage ($V_{ref+}$) 158b from a differential value (i.e., $I_{s1}-I_{s2}$) between sampling switch output signal 148a based on sampling current ($I_{s1}$) 146a and sampling switch output signal 148b based on sampling current ($I_{s2}$) 146b. In some embodiments, electromechanical noise on $V_{d1}-V_{d2}$ can be correlated to $I_{s1}-I_{s2}$, and can be removed or subtracted out by differential noise rejection stage 170". In some embodiments, differential noise rejection stage 170" can be configured to remove the electromechanical noise from output voltages ($V_{out1}$, $V_{out2}$) 196a, 196b at output voltage contacts 198a, 198b. In some embodiments, differential noise rejection stage 170" can be configured to remove voltage ripples (i.e., electromechanical noise) of damping voltages ($V_{d1}$, $V_{d2}$) 150a, 150b. For example, differential noise rejection stage 170" can remove damping reference voltages ($V_{ref-}$, $V_{ref+}$) 158a, 158b from output voltages ($V_{out1}$, $V_{out2}$) 196a, 196b at output voltage contacts 198a, 198b. For example, differential noise rejection stage 170" can subtract damping reference voltages ($V_{ref-}$, $V_{ref+}$) 158a, 158b from sampling switch output signals 148a, 148b, respectively. In some embodiments, electromechanical noise on a differential value (i.e., $V_{d1}-V_{d2}$) between damping reference voltage ($V_{ref}$) 158a and damping reference voltage ($V_{ref+}$) 158b can be correlated to a differential value (i.e., $I_{s1}-I_{s2}$) between sampling switch output signal 148a based on sampling current ($I_{s1}$) 146a and sampling switch output signal 148b based on sampling current ($I_{s2}$) 146b, and can be removed or subtracted out by differential noise rejection stage 170".

In some embodiments, in step 810, electromechanical noise can be removed from output voltage ($V_{out}$) 196. In some embodiments, the reducing includes removing damping reference voltage ($V_{ref}$) 158 from sampling switch output signal 148. For example, as shown in FIG. 3, differential noise rejection stage 170" can subtract damping reference voltages ($V_{ref-}$, $V_{ref+}$) 158a, 158b from sampling switch output signals 148a, 148b.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. A sensor apparatus comprising:
    a resonator;
    a transducer configured to detect a position of the resonator;
    a damping resistor configured to electrostatically actuate the transducer and convert a thermomechanical noise of the resonator to an electromechanical noise;
    a first switch configured to receive a first signal from the transducer;
    a filter stage configured to receive the first signal and adjust a phase and a gain of the first signal and output a filtered first signal;
    a second switch configured to receive a second signal from the transducer; and
    a noise rejection stage configured to receive the filtered first signal and the second signal and reduce the filtered first signal from an output signal of the noise rejection stage,
    wherein the first switch is controlled by a first phase signal and is configured to open or close an electrical pathway between the transducer and the damping resistor,
    wherein the second switch is controlled by a second phase signal and is configured to open or close an electrical pathway between the transducer and the noise rejection stage, and
    wherein, in a first configuration, the first switch is open and the second switch is closed, and a pulse input voltage to the resonator produces a current correlated to the electromechanical noise.

2. The sensor apparatus of claim 1, wherein, in a first second configuration, the first switch is closed and the second switch is open, and a voltage difference between a constant input voltage to the resonator and a common voltage to the damping resistor electrostatically actuates the transducer and converts the thermomechanical noise of the resonator to the electromechanical noise.

3. The sensor apparatus of claim 1, wherein the filter stage comprises a Sallen-Key topology and is configured to have an infinite input impedance and a zero output impedance.

4. The sensor apparatus of claim 1, wherein the filtered first signal outputted by the filter stage matches a phase and a gain of the second signal.

5. The sensor apparatus of claim 1, wherein the noise rejection stage comprises an analog front end configured to increase a gain of the second signal.

6. The sensor apparatus of claim 5, wherein the analog front end comprises a transimpedance amplifier.

7. The sensor apparatus of claim 1, wherein a sense axis of the transducer is aligned along a drive mode of the resonator.

8. The sensor apparatus of claim 1, wherein a sense axis of the transducer is aligned along a sense mode of the resonator.

9. The sensor apparatus of claim 1, wherein the resonator comprises a quality factor (Q) of 1,000 to 50,000.

10. The sensor apparatus of claim 1, wherein the resonator comprises a microelectromechanical system (MEMS) configured to adjust the position of the resonator.

11. The sensor apparatus of claim 1, wherein the sensor apparatus comprises an accelerometer, a gyroscope, a pressure sensor, a resonator, or a magnetometer.

12. The sensor apparatus of claim 1, wherein the output signal is a first output signal, and the sensor apparatus further comprises:
    a second transducer configured to detect a second position of the resonator;
    a second damping resistor configured to electrostatically actuate the second transducer and convert the thermomechanical noise of the resonator to a second electromechanical noise;
    a third switch configured to receive a third signal from the second transducer;
    a second filter stage configured to receive the third signal and adjust a phase and a gain of the third signal and output a filtered third signal; and
    a fourth switch configured to receive a fourth signal from the second transducer,
    wherein the noise rejection stage is configured to receive the filtered third signal and the fourth signal and reduce the filtered third signal from a second output signal, and
    wherein the noise rejection stage is configured to make a differential measurement between the output signal and the second output signal.

13. A differential sensor system comprising:
    a resonator;
    a transducer configured to detect a first position of the resonator;
    a second transducer configured to detect a second position of the resonator;
    a damping resistor configured to electrostatically actuate the transducer and convert a thermomechanical noise of the resonator to an electromechanical noise;
    a second damping resistor configured to electrostatically actuate the second transducer and convert the thermomechanical noise of the resonator to a second electromechanical noise;

a first switch configured to receive a first signal from the transducer;

a filter stage configured to receive the first signal and adjust a phase and a gain of the first signal and output a filtered first signal;

a second switch configured to receive a second signal from the transducer;

a third switch configured to receive a third signal from the second transducer;

a second filter stage configured to receive the third signal and adjust a phase and a gain of the third signal and output a filtered third signal;

a fourth switch configured to receive a fourth signal from the second transducer;

a noise rejection stage configured to receive the filtered first signal, the second signal, the filtered third signal, and the fourth signal, and reduce a first differential value between the filtered first signal and the filtered third signal from a second differential value between the second signal and the fourth signal;

a first integrating capacitor coupled to the noise rejection stage;

a fifth switch configured to reset a charge on the first integrating capacitor;

a second integrating capacitor coupled to the noise rejection stage; and a sixth switch configured to reset a charge on the second integrating capacitor, wherein the first and third switches are controlled by a first phase signal, wherein the second and fourth switches are controlled by a second phase signal, wherein the fifth and sixth switches are controlled by a third phase signal, and wherein the differential sensor system is time-multiplexed.

14. The differential sensor system of claim 13, wherein:

in a first configuration, the first, third, fifth, and sixth switches are closed and the second and fourth switches are open, and a voltage difference between a constant input voltage to the resonator and a common voltage to the damping resistor and the second damping resistor electrostatically actuates the transducer and the second transducer and converts a differential thermomechanical noise of the resonator to a differential electromechanical noise; and in a second configuration, the first, third, fifth, and sixth switches are open and the second and fourth switches are closed, and a pulse input voltage to the resonator produces a differential current correlated to the differential electromechanical noise.

* * * * *